(12) United States Patent
Chani et al.

(10) Patent No.: US 11,906,364 B2
(45) Date of Patent: Feb. 20, 2024

(54) FLEXIBLE INFRARED IRRADIATION AND TEMPERATURE SENSORS

(71) Applicant: King Abdulaziz University, Jeddah (SA)

(72) Inventors: Muhammad Tariq Saeed Chani, Jeddah (SA); Khasan S. Karimov, Jeddah (SA); Abdullah M. Asiri, Jeddah (SA); Tahseen Kamal, Jeddah (SA)

(73) Assignee: KING ABDULAZIZ UNIVERSITY, Jeddah (SA)

( * ) Notice: Subject to any disclaimer, the term of this patent is extended or adjusted under 35 U.S.C. 154(b) by 417 days.

(21) Appl. No.: 17/368,026

(22) Filed: Jul. 6, 2021

(65) Prior Publication Data

US 2023/0009532 A1 Jan. 12, 2023

(51) Int. Cl.
*G01J 5/22* (2006.01)
*H10K 30/00* (2023.01)
*H10K 85/20* (2023.01)
*H10K 85/30* (2023.01)
*H10K 77/10* (2023.01)

(52) U.S. Cl.
CPC .............. *G01J 5/22* (2013.01); *H10K 30/451* (2023.02); *H10K 85/221* (2023.02); *H10K 85/311* (2023.02); *H10K 77/10* (2023.02)

(58) Field of Classification Search
CPC ........ H01L 35/00–34; H01L 51/00–56; H10K 30/451; H10K 30/60; H10K 85/221; H10K 85/311; H10K 77/10; G01J 5/023; G01J 5/0853; G01J 5/22
See application file for complete search history.

(56) References Cited

U.S. PATENT DOCUMENTS

| | | |
|---|---|---|
| 9,631,989 B1 | 4/2017 | Asiri et al. |
| 10,994,387 B1 | 5/2021 | Chani et al. |
| 2010/0031992 A1* | 2/2010 | Hsu ............... H01L 35/32 136/223 |
| 2015/0053927 A1 | 2/2015 | Arnold et al. |
| 2017/0052135 A1 | 2/2017 | Voiculescu et al. |

FOREIGN PATENT DOCUMENTS

WO WO-2018047882 A1 * 3/2018 ............. H01L 51/00

OTHER PUBLICATIONS

Shafique, et al. "Carbon nanotubes, orange dye, and graphene powder based multifunctional temperature, pressure, and displacement sensors." Journal of Materials Science: Materials in Electronics 31.11 (2020): 8893-8899.*

(Continued)

*Primary Examiner* — Mayla Gonzalez Ramos
(74) *Attorney, Agent, or Firm* — WCF IP

(57) ABSTRACT

A flexible infrared irradiation and temperature sensor is provided. The sensor includes a substantially cubic deformable rubber substrate and a conductive layer embedded in the rubber substrate, wherein the conductive layer comprises a middle portion comprising a composite film of carbon nanotubes (CNTs) and nickel phthalocyanine (NiPc); and one or more exterior portions comprising carbon nanotubes, wherein the one or more exterior portions do not include NiPc.

9 Claims, 7 Drawing Sheets

(56) References Cited

OTHER PUBLICATIONS

Chani, et al. "Impedimetric multifunctional Sensor Based on Rubber-CNTs-orange Dye Nanocomposite Fabricated by Rubbing-in Technology." International Journal of Electrochemical Science 16.7 (2021).*

Fatima, et al. "Effect of heating on the impedance of NiPc based organic field effect transistor." Proc. of the 2016 Int. Conf. on Industrial Engineering and Operations Management. Kuala Lumpur, 2016.*

Asghar, et al. "Multifunctional organic shockproof flexible sensors based on a composite of nickel phthalocyanine colourant, carbon nanotubes and rubber created with rubbing-in technology." Coloration Technology (2021).*

Karimov et al., "Fabrication of flexible conductive films by rubbing in technology for application in elastic thermo-electric cells", MethodsX 6 (2019) 424-427.

* cited by examiner

FLEXIBLE INFRARED IRRADIATION AND TEMPERATURE SENSORS

FIELD OF THE INVENTION

The invention is generally related to rubber-based, shock proof, flexible infrared irradiation and temperature sensors comprising carbon nanotubes and nickel phthalocyanine.

BACKGROUND OF THE INVENTION

A silver-based thermistor on a temperature sensitive flexible substrate was fabricated using inkjet printing (low temperature) technology and presented in ref. [5]. The substrate temperature was limited by 50° C. Another printed temperature sensor was described in ref. [1]. In this case, the silicon layer was formed by ink printing, using silicon ink containing silicon particles in the range of 10 nm to 100 µm, while a binder with solvent was used as a liquid vehicle. The substrate which may be used may be rigid or flexible or of a sacrificial or template type. Devices for temperature sensing may be thermistors of negative temperature coefficient (NTC). A temperature measuring device and temperature measuring method were described in ref. [6]. This device can measure temperature of older persons or of infants. The results can be transmitted through radio and are received by computer. Textile integrated thermocouples for temperature measurements were presented in ref. [7]. In this case, various substrates such as cotton, cellulose, carbon, polymeric and optical fiber-based textiles were used for temperature sensors. The use of thermocouples for temperature measurement was also discussed. A printed thermistor on a metal sheet was described in ref. [8]. The non-adjustable NTC resistors made of one or more layers of conducting or semiconducting powders or coatings having or not having insulating layers were discussed.

An overview of infrared (IR) detectors is presented in ref. [9]. On the basis of operating principles, the IR detectors were classified as thermal detectors and photon detectors. More recently developed detectors include quantum well AlGaAs/GaAs photoresistors, HgCdTe hetero-structure photodiodes, and thermal detectors.

Analysis of the previous studies concerning infrared and temperature sensors show that, firstly, the selected materials and technology of fabrication are expensive, energy consuming and are not environmentally friendly. Secondly, the construction of the sensors allows to receive the infrared irradiation only from one direction, meaning that the sensor cannot receive total infrared irradiation from different directions at the same time. Thirdly, the construction of the sensors is not shockproof, and the sensors can be damaged under the effect of mechanical influence. Thus, improved infrared and temperature sensors that overcome these drawbacks are needed.

SUMMARY

An aspect of the disclosure provides a flexible infrared irradiation and temperature sensor, comprising a substantially cubic deformable rubber substrate; and a conductive layer embedded in the rubber substrate, wherein the conductive layer comprises a middle portion comprising a composite film of carbon nanotubes (CNTs) and nickel phthalocyanine (NiPc); and one or more exterior portions comprising carbon nanotubes, wherein the one or more exterior portions do not include NiPc. In some embodiments, the composite layer has two exterior portions, each containing a metallic wire electrode sewed into the substrate. In some embodiments, the surfaces of the substrate not covered with the conductive layer are covered with an opaque dye as an infrared irradiation absorbing layer. In some embodiments, the composite film covers 30-50% of a surface of the substrate.

In some aspects of the disclosure, the substrate has a size of 8-12 mm$^3$. In some embodiments, the conductive layer has a thickness of 22-28 µm. In some embodiments, the ratio of CNT to NiPc in the composite film is from 30:70 wt % to 50:50 wt %. In some embodiments, the sensor is configured to present a linear response when the intensity of infrared irradiation changes. In some embodiments, the sensor is configured to receive infrared irradiation from three orthogonal sides of the sensor. In some embodiments, an impedance of the sensor depends on a frequency of an applied voltage such that the sensor is configured for demodulation of frequency modulated signal. In some embodiments, the sensor is configured as a low-pass filter at parallel connection with respect to a load and as a high-pass filter at series connection with respect to a load.

DETAILED DESCRIPTION

Embodiments of the disclosure provide rubber-based shock proof flexible temperature and infrared irradiation sensors comprising carbon nanotubes (CNTs) and nickel phthalocyanine (NiPc).

The term "sensors", as used herein, refers to a tangible and physical structure that includes a plurality of circuitry layers (e.g., conductive and/or semiconductive layer) and responds to inputs from a physical environment or stimuli in a particular way as dictated by the circuitry. The directed configuration data of the sensor can be in the form of software accessible from a circuit.

Figure 1:
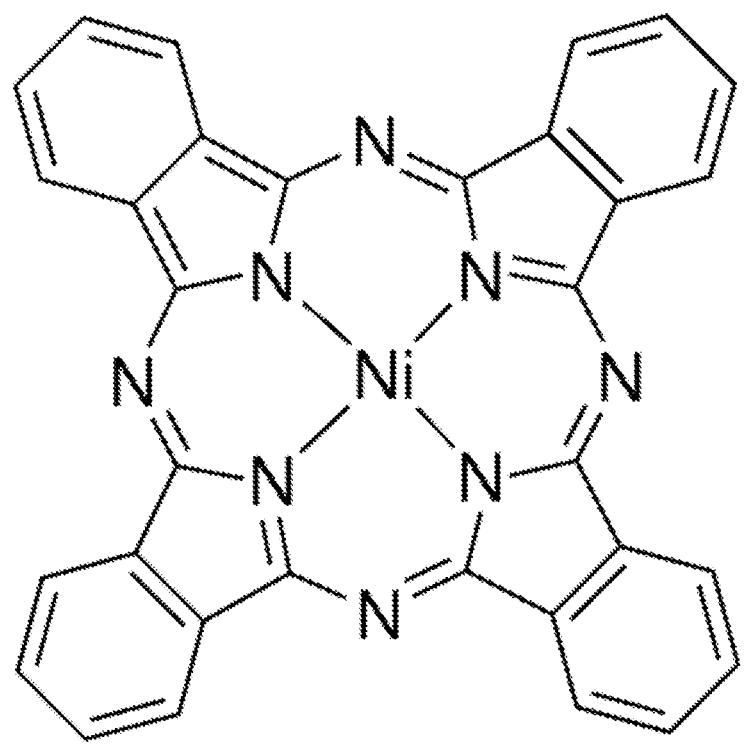
FIG. 1. Diagram of molecular structure of NiPc.
Figure 2:
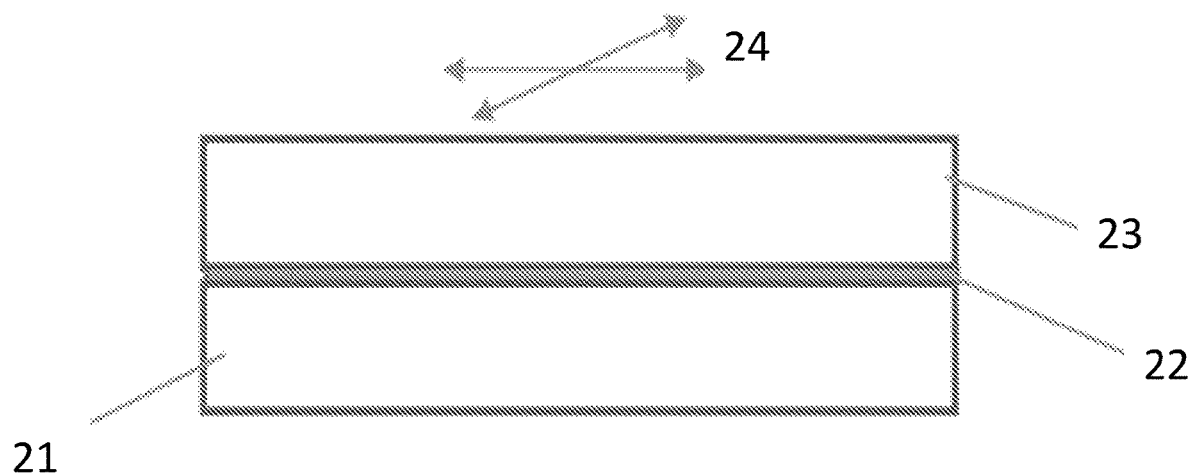
FIG. 2. Diagram of a temperature and infrared irradiation sensor according to some embodiments of the disclosure.

With reference to FIG. 2, embodiments in accordance with the present disclosure include a conductive layer 22 made of CNTs and/or CNT-NiPc mixture embedded on a deformable substrate 21. The molecular structure of NiPc is shown in FIG. 1. NiPc has the molecular formula ($C_{32}H_{16}N_8Ni$), a molecular weight of 571.22, and is an organic semiconductor. Multiwalled CNTs are elongated cylindrical nanoobjects made of sp$^2$ carbon. They have an average diameter of 10-30 nm and an average length of 100-200 µm.

The term "substrate", as used herein, refers to an underlying layer of a material or combinations of materials that supports the primary layers (e.g., the conductive layer). The substrate materials may include metal or nonmetal natural elements, and deformable and flexible materials. The deformable substrate may be any material or combination of materials that are compressible or elastic, such as a stretchable rubber or similar materials such as silicone, styrene-butadiene rubber, natural rubber, butyl rubber, nitrile rubber, neoprene rubber, ethylene, viton, and combinations thereof. In some applications, a hard rubber, such as styrene-butadiene is preferred.

Figure 3A:
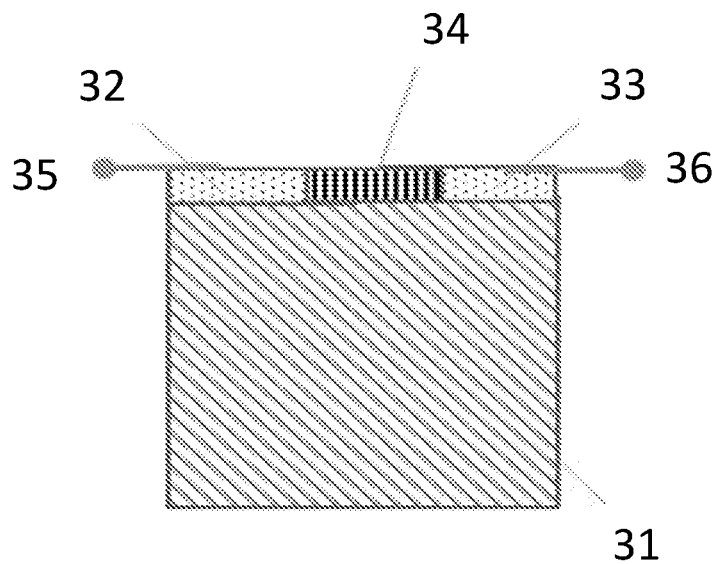
FIGS. 3A-B. (A) Front view and (B) top view of a temperature and infrared irradiation sensor according to some embodiments of the disclosure.
Figure 3B:
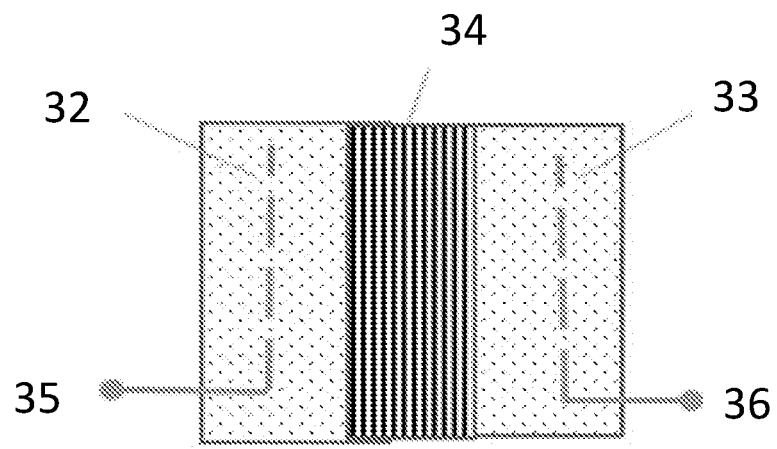

With reference to FIGS. 3A-B, in some embodiments, the conductive layer embedded in the substrate 31 comprises a middle portion 34 comprising a composite film of CNTs and NiPc and one or more exterior portions 32, 33 comprising carbon nanotubes, wherein the one or more exterior portions do not include NiPc. The sensor also comprises electrodes 35, 36 sewed in rubber. In some embodiments, metallic electrodes (fine wires) 35, 36 are sewed (built-in) into the rubber substrate through the CNT film (contact electrode film) to provide a reliable contact of the sensitive material (CNT and NiPC composite) with resistance and impedance measuring devices.

The sensors described herein are substantially cubic in shape in order to receive infrared irradiation from all directions for the detection of total effect. The term "substantially", such as "substantially cubic," as used in this disclosure, refers to exactly cubic and/or one or more deviations from exactly cubic that do not significantly impact functions described herein, i.e. reception of infrared irradiation from all directions. In some embodiments, the sensor is configured to receive infrared irradiation from three orthogonal sides of the sensor.

Embodiments of the disclosure also include methods of making a sensor as described herein. In some embodiments, rubbing-in technology is used to fabricate the NiPc-CNT composite films. As the contact electrodes to the infrared irradiation sensitive film, the CNT thin layers may also be deposited by rubbing-in technology as well. This technology is simple, reliable, and inexpensive, especially if the substrate is porous. U.S. Pat. No, 10,994,387 to Chani, incorporated herein by reference, describes methods of using rubbing-in technology.

The mixture of CNTs and NiPc may be prepared using mortar and pestle. In some embodiments, the ratio of CNT to NiPc in the composite film is from 30:70 wt % to 50:50 wt %, e.g. about 40:60 wt %. Methods of thin film fabrication are known in the art, e.g. as described in ref. [10, 11]. As shown in FIG. 2, in an exemplary manufacturing process, a portion of the substrate 21 is covered uniformly by powders of CNTs or a mixture of CNTs and NiPc 22. The NiPc, when in a powder form, may have a mean particle size/diameter of 10-22 μm, preferably 11-20 μm or more preferably 13-19 μm. A round or square shaped polished metallic block 23 (i.e. rubber densifier) may be used to rub the powder onto the rubber surface using a mechanism which controls the frequency and direction 24 of the block. FIG. 2 shows arrows going in the lengthwise direction and widthwise direction of the rubber substrate; however, the block can move in any direction, including circularly, etc. The goal of the rubbing-in operation is to cause the conductive powder and/or conducting/semiconducting powder to penetrate into the enlarged pores of the rubber.

In some embodiments, the substrate may be used without pre-stretching. Pre-stretching of the substrate prior to rubbing-in the conductive powder or a mixture of conductive and semiconductive powder enlarges the pores of the rubber and makes the surface more receptive to embedding the conductive material and semiconductive materials. An appropriate and sufficient pressure known in the art for this procedure may be selected, e.g. at pressure of 40-50 g/cm$^2$, e.g. about 45 g/cm$^2$.

In some embodiments, the dimension of each side of the cubic substrate (length, width, and height) has a size of 8-12 mm e.g. about 10×10×10 mm$^3$. On one side of the substrate, the NiPc-CNT composite film is deposited. The thickness of the NiPc-CNT film may be in the range of 22-28 μm, e.g. about 24-26 μm. The width of the NiPc-CNT film may be 2-6 mm, e.g. about 4 mm. The length of the NiPc-CNT film may be 8-12 mm, e.g. about 10 mm. The thickness of the CNT contact film may be in the range of 22-28 μm, e.g. about 24-26 μm. The width of the CNT contact film may be 2-6 mm, e.g. about 4 mm. The length of the CNT contact film may be 8-12 mm, e.g. about 10 mm. In some embodiments, the NiPc-CNT composite film covers 30-50% of a surface of the substrate with the CNT contact film covering the remaining surface of the substrate.

The patterned composite of FIG. 3 can be made by first rubbing-in a conductive powder (e.g., CNTs) over all or a part of a surface of a rubber substrate while the rubber substrate is under stress (i.e., stretched) or not under stress. Then, one or more portions of the region embedded with the conductive powder are removed to expose one or more portions of bare rubber, e.g. a central or middle region. This can be accomplished by cutting away, or otherwise excising the embedded CNT powder and rubber in a central stripe across the surface of the rubber substrate. Then, a powder of semiconductive material and conductive material (CNTs and NiPc mixture) can be rubbed into the surface of the rubber substrate at the exposed region.

In some embodiments, one or more sides of the cubic substrate are covered with an opaque dye, e.g. a black dye, as an infrared irradiation absorbing layer to maximize the absorption of infrared irradiation.

Another aspect of the disclosure provides a method of using a sensor system as described herein. For example, the method includes passing a current through the conductive layers of the sensor system, receiving inputs of temperature or infrared irradiation, measuring changes in current in response to the inputs; and producing an output signal indicative of the applied temperature or infrared irradiation.

To demonstrate the utility of the invention, a sensor as shown in FIG. 3 was constructed and tested under various conditions.

Resistance and impedance in the frequency range of 0.1-200 kHz were measured by the digital LCR meter MT 4090. The Philips infrared lamp (230V and 100 W) was used as a source of infrared radiation. The power meter LS122 IR was used to measure the intensity of infrared radiation. The effect of the temperature was investigated by the use of a special chamber. For the measurement of temperature, the TECPEL 322 meter was used.

Figure 4:
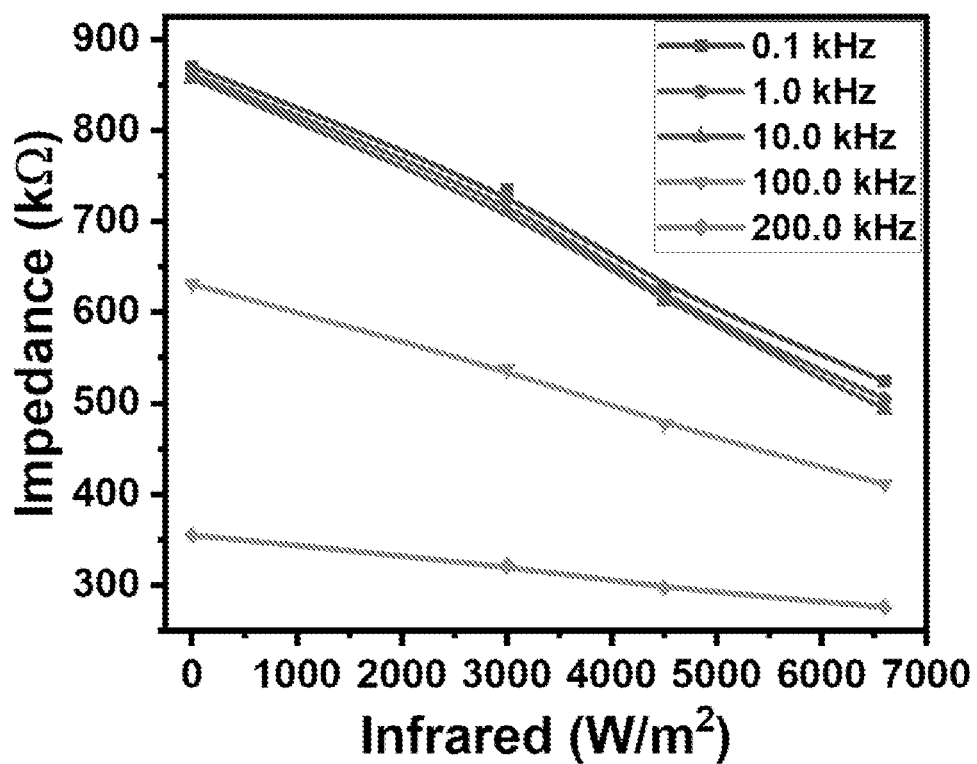
FIG. 4. Resistance and impedance dependences of the rubber-based CNT/NiPc-CNT/CNT sensors on the intensity of infrared irradiation.

FIG. 4 shows the sensor's behavior under the effect of infrared irradiation. It can be seen from the FIG. 4 that on increasing the intensity of irradiation, the resistance as well as the impedance of the sensor decreases. The resistance-irradiation and impedance-irradiation relationships are linear. On increasing the irradiation intensity from 0 to 6600 W/m$^2$, the resistance decreases on the rate of 53.79 Ω-m$^2$/W, while the impedance decreases on the rate of 11.97 Ω m$^2$/W to 55.0 Ωm$^2$/W depending on the measuring frequency. On increasing the irradiation intensity from 0 to 6600 W/m$^2$, the sensor showed resistance-infrared sensitivity up to 39.6%, while the impedance-infrared sensitivity was found up to 42.4%. But at higher frequencies, the sensor showed the lower sensitivity. Dependences of the resistance and the impedances of the sensor on the intensity of the infrared irradiation ($I_{IR}$) (FIG. 4) can be characterized by the following equations:

For resistance-infrared irradiation relationship the value of $I_{IR}$ can be calculated as $$I_{IR}=dR/d(IR) \quad (1)$$

For impedance-infrared irradiation relationship the value of $I_{IR}$ can be calculated as $$I_{IR}=dZ/d(IR) \quad (2)$$

where dR, dZ and d(IR) are the changes in the resistance, impedance, and infrared irradiation, respectively. The calculated value $I_{IR}$ was equal to 53.8 $\Omega m^2/W$ for the resistance. For impedance the $I_{IR}$ values were calculated as 52.4 $\Omega m^2/W$, 54.1 $\Omega m^2/W$, 55.0 $\Omega m^2/W$, 33.3 $\Omega m^2/W$ and 12.0 $\Omega m^2/W$ at the frequencies of 100 Hz, 120 Hz, 1 kHz, 10 kHz, 100 kHz and 200 kHz, respectively.

Figure 5:
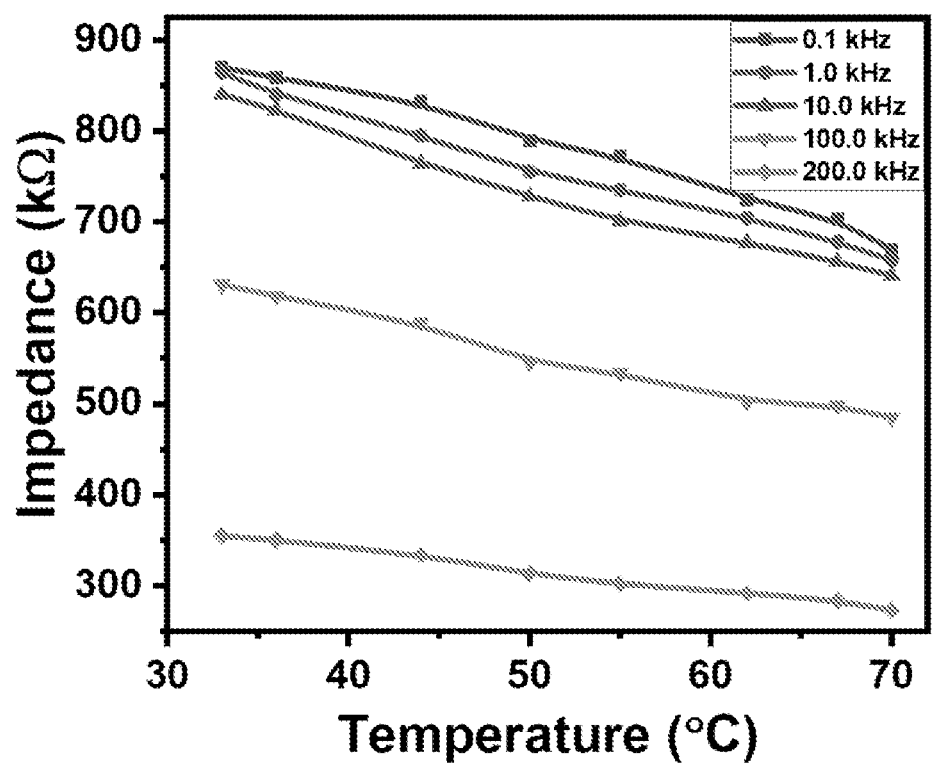
FIG. 5. Resistance and impedance dependences of the rubber-based CNT/NiPc-CNT/CNT sensors on the temperature.

FIG. 5 shows the effect of temperature on the resistance and the impedance of the sensor. It is evident from FIG. 5 that on increasing temperature, both resistance and the impedance decrease. The average rate of change of resistance is 5600$\Omega$/° C., while the rate of change of impedance varies with frequency and it ranges from 2200k$\Omega$/° C. to 5560k$\Omega$/° C. on average.

For the dependences of the resistance and impedance of the sensor on the temperature, the TCR (temperature coefficient of resistance) was calculated using the expression $\sigma$=dR/RdT (where dR and dT are the change in resistance and temperature, respectively). The calculated value of TCR for resistance is 0.64%/° C. The values of TCR for the impedance are in the range of 0.62%/° C. to 0.64%/° C. at various frequencies.

Figure 6:
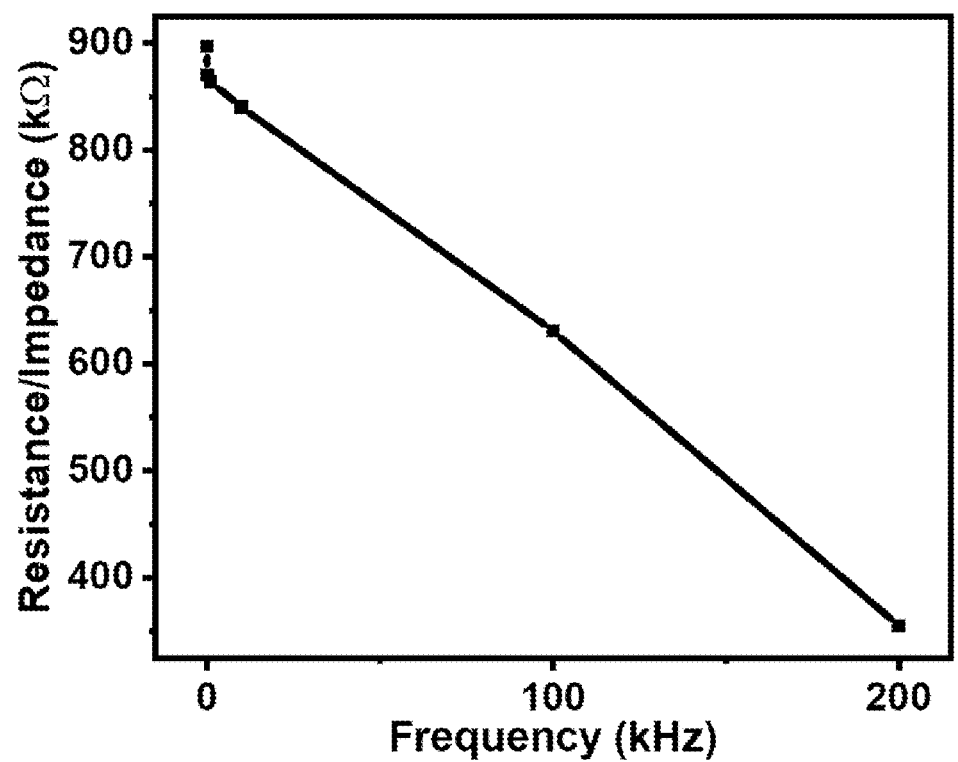
FIG. 6. Impedance and frequency relationship for the rubber-based CNT/NiPc-CNT/CNT sensors.

FIG. 6 shows the resistance/impedance-frequency relationship. It can be seen from the FIG. 6 that on increasing frequency, the resistance/impedance decreases. The change in resistance/impedance with respect to frequency is linear. On increasing frequency from 0 to 200 kHz, the resistance/impedance decreases at the rate of 2710 $\Omega$/kHz on average.

Figure 7:
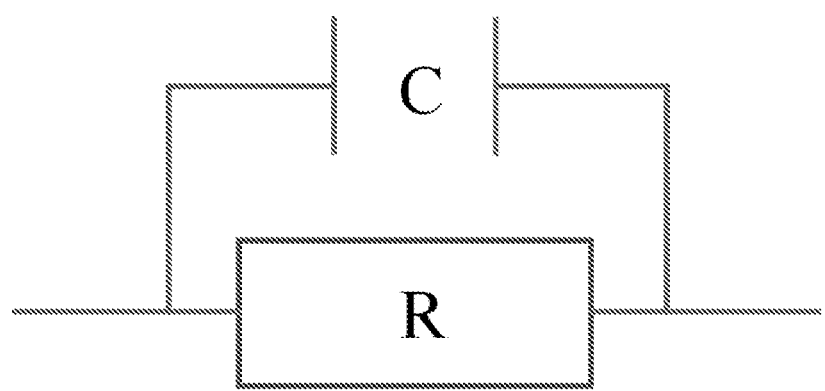
FIG. 7. The equivalent circuit of the rubber-based CNT/NiPc-CNT/CNT sensors.

Usually, the impedances are frequency dependent. The fabricated infrared sensor shows properties similar to that of electronic filters [12]. By the use of this sensor, the fabrication of low and high pass filters is possible. The impedance of the sample can be represented as parallel connection of the capacitor and resistor (FIG. 7), the contribution of the capacitance to the impedance is much as well as resistance. The impedance (Z) of the circuit shown in FIG. 7 is equal to [13]:

$$Z=R(1+i\omega RC) \quad (3)$$

where, C is equivalent capacitance, R is equivalent resistance, $\omega$ is angular frequency.

The physical reason for the impedance—frequency relationship of the CNT/NiPc-CNT/CNT sensor may be the following: The sensors can be replaced by the equivalent circuit shown in FIG. 7. As the frequency increases the impedance of the capacitor decreases that bring a decrease in total impedance of the circuit (FIG. 7).

The reason behind such behavior of resistance and impedances under the effect of temperature (FIG. 5) may be the following: The temperature dependence of the resistance likely takes place, first of all, due to presence of the gap in energy spectrum of the nickel phthalocyanine, which may be approximately similar to the silicon. Due to this, the increase in temperature may cause an increase in the concentration of charges and accordingly to increase the conductance. Moreover, the increase in temperature can increase the mobility of the charges in nickel phthalocyanine due to the presence of hopping mechanism of conductivity, which is very common in organic semiconductors. This mechanism is associated with the presence of Van-der Waals forces between molecules in the organic semiconductors as they are presenting molecular system. Therefore, on increasing temperature, the resistance and impedance of the sensor decrease (FIG. 5). At the same time, the increase in the frequency also causes a decrease in the impedance of the samples that can be due to a decrease in capacitive impedance of the sensors. This may happen when the equivalent circuit of the sensor is considered as parallel connecting resistance and capacitance.

In summary, rubbing-in technology was used to fabricate a rubber-based shock proof flexible temperature and infrared irradiation sensor comprising CNTs and NiPc. The effect of infrared irradiation and temperature on the resistance and impedance of the sensor was studied. On changing the intensity of irradiation from 0 to 6600 W/m$^2$, the resistance decreases at the rate of 53.79 $\Omega$-m$^2$/W, while the impedance decreases at the rate of 11.97 $\Omega m^2/W$ to 55.0 $\Omega$ m$^2$/W depending on the measuring frequency. Similarly, both parameters (resistance and impedance) decrease on increasing the temperature. On changing temperature 33° C. to 70° C., the average rate of change of resistance was 5600$\Omega$/° C., while the rate of change of impedance varied with frequency and it ranged from 2200 k$\Omega$/° C. to 5560 k$\Omega$/° C. on average. The increase in the frequency also causes a decrease in the impedance of the samples that can be due to a decrease in capacitive impedance of the sensors. As the fabricated sensor's impedance depends on the frequency of the applied voltage, it can be used for the demodulation of frequency modulated signals. The sensors can also be used as a low-pass filter at parallel connection with respect of the load and as a high-pass filter at series connection with respect to the load.

Before exemplary embodiments of the present invention are described in greater detail, it is to be understood that this invention is not limited to particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range, is encompassed within the invention. The upper and lower limits of these smaller ranges may independently be included in the smaller ranges and are also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, representative illustrative methods and materials are now described.

All publications and patents cited in this specification are herein incorporated by reference as if each individual publication or patent were specifically and individually indicated to be incorporated by reference and are incorporated herein by reference to disclose and describe the methods and/or materials in connection with which the publications are cited. The citation of any publication is for its disclosure prior to the filing date and should not be construed as an admission that the present invention is not entitled to antedate such publication by virtue of prior invention. Further, the dates of publication provided may be different from the actual publication dates which may need to be independently confirmed.

It is noted that, as used herein and in the appended claims, the singular forms "a", "an", and "the" include plural referents unless the context clearly dictates otherwise. It is further noted that the claims may be drafted to exclude any optional element. As such, this statement is intended to serve as antecedent basis for use of such exclusive terminology as "solely," "only" and the like in connection with the recitation of claim elements, or use of a "negative" limitation.

As will be apparent to those of skill in the art upon reading this disclosure, each of the individual embodiments described and illustrated herein has discrete components and features which may be readily separated from or combined with the features of any of the other several embodiments without departing from the scope or spirit of the present invention. Any recited method can be carried out in the order of events recited or in any other order which is logically possible.

While the invention has been described in terms of its preferred embodiments, those skilled in the art will recognize that the invention can be practiced with modification within the spirit and scope of the appended claims. Accordingly, the present invention should not be limited to the embodiments as described above, but should further include all modifications and equivalents thereof within the spirit and scope of the description provided herein.

ACKNOWLEDGMENT

The inventors extend their appreciation to the Deputyship for Research & Innovation, Ministry of Education in Saudi Arabia for funding this research work through the project number "047-2021" and King Abdulaziz University, DSR, Jeddah, Saudi Arabia.

REFERENCES

[1] D. T. Britton, M. Harting, Printed temperature sensor, in, US Patents, U.S. Pat. No. 9,029,180, 2015.
[2] A. Rogalski, Quantum well photoconductors in infrared detector technology, Journal of Applied Physics, 93 (2003) 4355-4391.
[3] A. Sommer, Method of making thin film thermistor, in, US Patents, U.S. Pat. No. 3,831,269, 1974.
[4] C.-s. Chang, W.-K. Chin, Polymeric positive temperature coefficient thermistor and process for preparing the same, in, US Patents, US20080186128, 2008.
[5] Y. Sui, L. P. Kreider, K. M. Bogie, C. A. Zorman, Fabrication of a Silver-Based Thermistor on Flexible, Temperature-Sensitive Substrates Using a Low-Temperature Inkjet Printing Technique, IEEE Sensors Letters, 3 (2019) 1-4.
[6] M. Sakano, Temperature measuring device and temperature measuring method, in, US Patents, U.S. Pat. No. 7,354,195, 2008.
[7] W. Root, T. Bechtold, T. Pham, Textile-integrated thermocouples for temperature measurement, Materials, 13 (2020) 626.
[8] J. W. Riddel, R. E. Schwyn, Printed thermistor on a metal sheet, in, US Patents, U.S. Pat. No. 3,469,224, 1969.
[9] A. Rogalski, Infrared detectors: an overview, Infrared physics & technology, 43 (2002) 187-210.
[10] M. T. S. Chani, K. S. Karimov, E. M. Bukhsh, A. M. Asiri, Fabrication and Investigation of Graphene-Rubber Nanocomposite Based Multifunctional Flexible Sensors, Int. J. Electrochem. Sci, 15 (2020) 5076-5088.
[11] K. S. Karimov, N. Fatima, K. J. Siddiqui, M. I. Khan, Flexible thermoelectric cells fabricated by rubbing-in technology with rubber-carbon nanotubes/graphene composites, Materials Science for Energy Technologies, 2 (2019) 551-555.
[12] M. Khan, M. Alam, M. Masud, A. Amin, Importance of High Order High Pass and Low Pass Filters, World Applied Sciences Journal, 34 (2016) 1261-1268.
[13] J. D. Irwin, R. M. Nelms, Basic engineering circuit analysis, 11th Edition ed., Wiley, 2015.

We claim:

1. A flexible infrared irradiation and temperature sensor, comprising:
    a substantially cubic deformable rubber substrate, wherein the substrate has at least three orthogonal surfaces configured to receive infrared irradiation; and
    a conductive layer embedded in the rubber substrate on at least one surface of the substrate, wherein the conductive layer comprises
        a middle portion comprising a composite film of carbon nanotubes (CNTs) and nickel phthalocyanine (NiPc); and
        one or more exterior portions comprising carbon nanotubes, wherein the one or more exterior portions do not include NiPc,
    wherein the surfaces of the substrate not covered with the conductive layer are covered with an opaque dye as an infrared irradiation absorbing layer, and
    wherein the rubber substrate is cubic.

2. The sensor of claim 1, wherein the composite layer has two exterior portions, each containing a metallic wire electrode sewed into the substrate.

3. The sensor of claim 1, wherein the composite film covers 30-50% of a surface of the substrate.

4. The sensor of claim 1, wherein each side of the substrate has a size of 8-12 mm.

5. The sensor of claim 1, wherein the conductive layer has a thickness of 22-28 μm.

6. The sensor of claim 1, wherein the ratio of CNT to NiPc in the composite film is from 30:70 wt % to 50:50 wt %.

7. The sensor of claim 1, wherein the sensor is configured to present a linear response when an intensity of infrared irradiation changes.

8. The sensor of claim 1, wherein an impedance of the sensor depends on a frequency of an applied voltage such that the sensor is configured for demodulation of frequency modulated signal.

9. The sensor of claim 1, wherein the sensor is configured as a low-pass filter at parallel connection with respect to a load and as a high-pass filter at series connection with respect to a load.

* * * * *